(12) United States Patent
Lu

(10) Patent No.: US 6,389,564 B1
(45) Date of Patent: May 14, 2002

(54) DRAM CIRCUIT HAVING A TESTING UNIT AND ITS TESTING METHOD

(75) Inventor: Hsin Pang Lu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/360,623

(22) Filed: Jul. 26, 1999

(51) Int. Cl.[7] ............................................. G11C 29/00
(52) U.S. Cl. ...................................... 714/718; 365/201
(58) Field of Search ................................. 714/718, 719, 714/763, 720, 710, 711; 365/200, 201

(56) References Cited

U.S. PATENT DOCUMENTS

| | | | | |
|---|---|---|---|---|
| 4,680,762 A | * | 7/1987 | Hardee et al. | 714/745 |
| 5,400,281 A | * | 3/1995 | Morigami | 365/201 |
| 5,428,574 A | * | 6/1995 | Kuo et al. | 365/201 |
| 5,638,323 A | * | 6/1997 | Itano | 365/185.22 |

* cited by examiner

Primary Examiner—Christine T. Tu
(74) Attorney, Agent, or Firm—Winston Hsu

(57) ABSTRACT

The invention relates to a memory having test units and its testing method. The memory comprises a plurality of word lines, a plurality of bit line groups each having two bit lines, a memory unit connected between each of the word lines and one bit line of each of the bit line groups, a plurality of writing units, a plurality of testing units, a plurality of bit line switches. When testing the memory unit, the control circuit first initiates the memory unit by using the word line connected to the memory unit, and then uses the writing unit connected to the memory unit to write a predetermined binary data bit into the memory unit through one output port of the writing unit connected to the memory unit and the bit line switch and bit line connected between the output port of the writing unit and the memory unit, and then switches off the bit line switch to disconnect the bit line connected to the output port of the writing unit, and finally using the testing unit connected to the output port and the disconnected bit line to test if the binary data bit outputted from the memory unit to the disconnected bit line is the same as the binary data bit outputted from the output port.

14 Claims, 3 Drawing Sheets

DRAM CIRCUIT HAVING A TESTING UNIT AND ITS TESTING METHOD

BACKGROUND OF THE INVENTION

1. Field of the Invention

The invention relates to a memory and its testing method, and more particularly, to a memory having test units and its testing method.

2. Description of the Prior Art

The prior art memory and its testing method must use a test machine for writing data into the memory and then reading out the data to compare with the original data. The prior art method can only test one, four or eight bits on one word line at a time. Generally, there are millions of memory units in one memory and much time is spent writing data into memory and reading it out for testing. Therefore, a lot of time is required to test all memory units which increases the production costs of the memory.

SUMMARY OF THE INVENTION

It is therefore a primary objective of the present invention to provide a memory and its testing method to test the memory more efficiently.

Briefly, in a preferred embodiment, the present invention provides a memory circuit comprising:

a plurality of word lines;

a plurality of bit line groups each having two bit lines;

a memory unit connected between each of the word lines and one bit line of each of the bit line groups wherein the word line connected to the memory unit is used for initiating the memory unit to input or output a binary data bit through the bit line connected to the memory unit;

a plurality of writing units, each of the writing units comprising two output ports separately connected to the two bit lines of one of the bit line groups for simultaneously outputting two opposite binary data bits;

a plurality of testing units, each of the testing units comprising at least two input ports separately connected to an output port of one writing unit and the bit line connected to the output port, and a test circuit for generating a test signal according to the inputs from the two input ports;

a plurality of bit line switches, each of the bit line switches being connected between one output port of each writing unit and the bit line connected to the output port for controlling the output from the output port to the bit line; and a control circuit for controlling the operations of the memory circuit;

wherein when testing the memory unit, the control circuit first initiates the memory unit by using the word line connected to the memory unit, and then uses the writing unit connected to the memory unit to write a predetermined binary data bit into the memory unit through one output port of the writing unit connected to the memory unit and the bit line switch and bit line connected between the output port of the writing unit and the memory unit, and then switches off the bit line switch to disconnect the bit line connected to the output port of the writing unit, and finally using the testing unit connected to the output port and the disconnected bit line to test if the binary data bit outputted from the memory unit to the disconnected bit line is the same as the binary data bit outputted from the output port.

It is an advantage of the present invention that the testing method of the memory tests all bits on one word line at one time, and it is not necessary to read out the data written in the memory for testing. Therefore, testing of the memory is more efficient, and the production costs of the memory is reduced. Also, a test machine is not required when testing the memory.

These and other objects and the advantages of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

Figure 1:
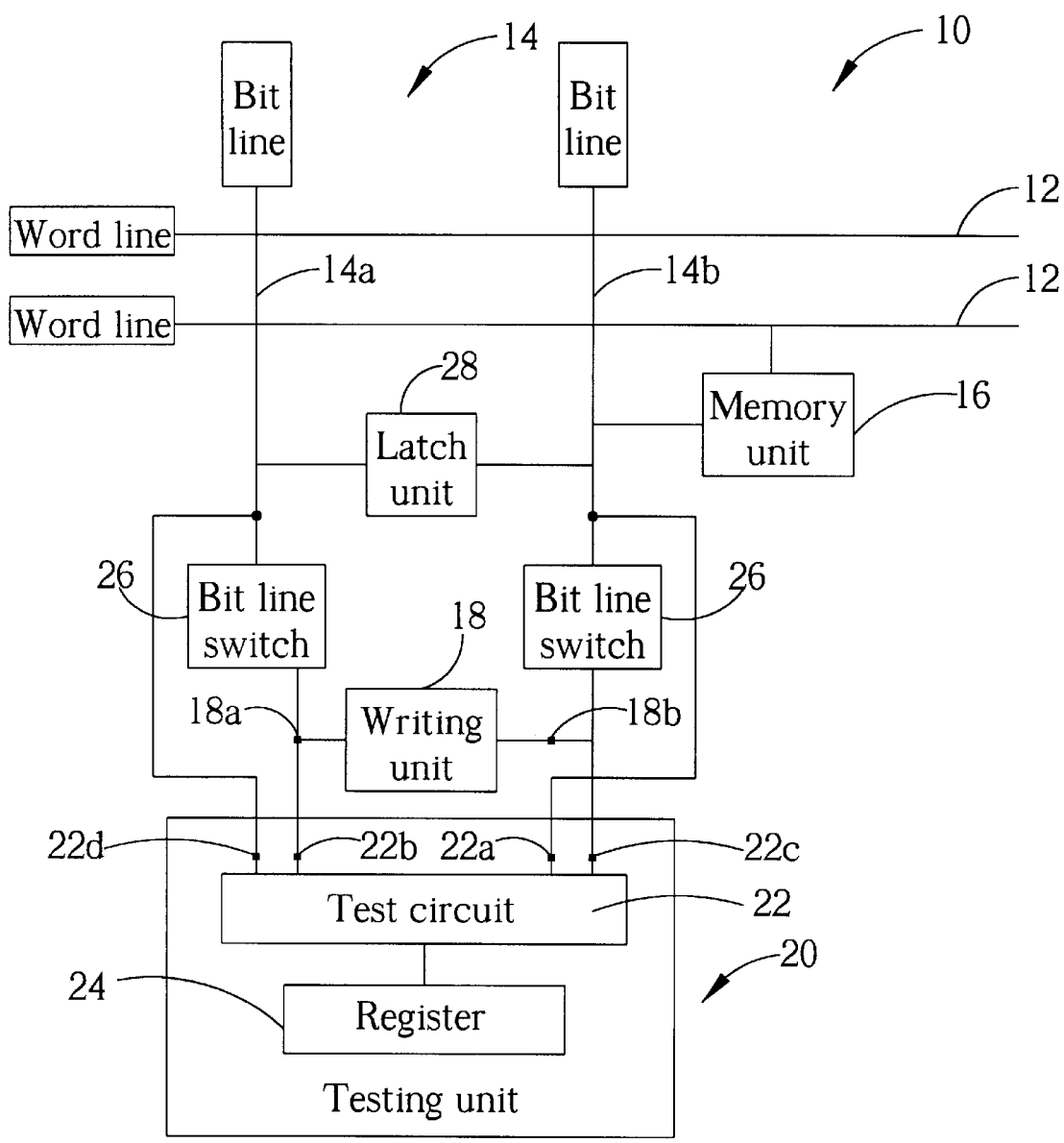
FIG. 1 is a block diagram of a memory according to the present invention.
Figure 2:
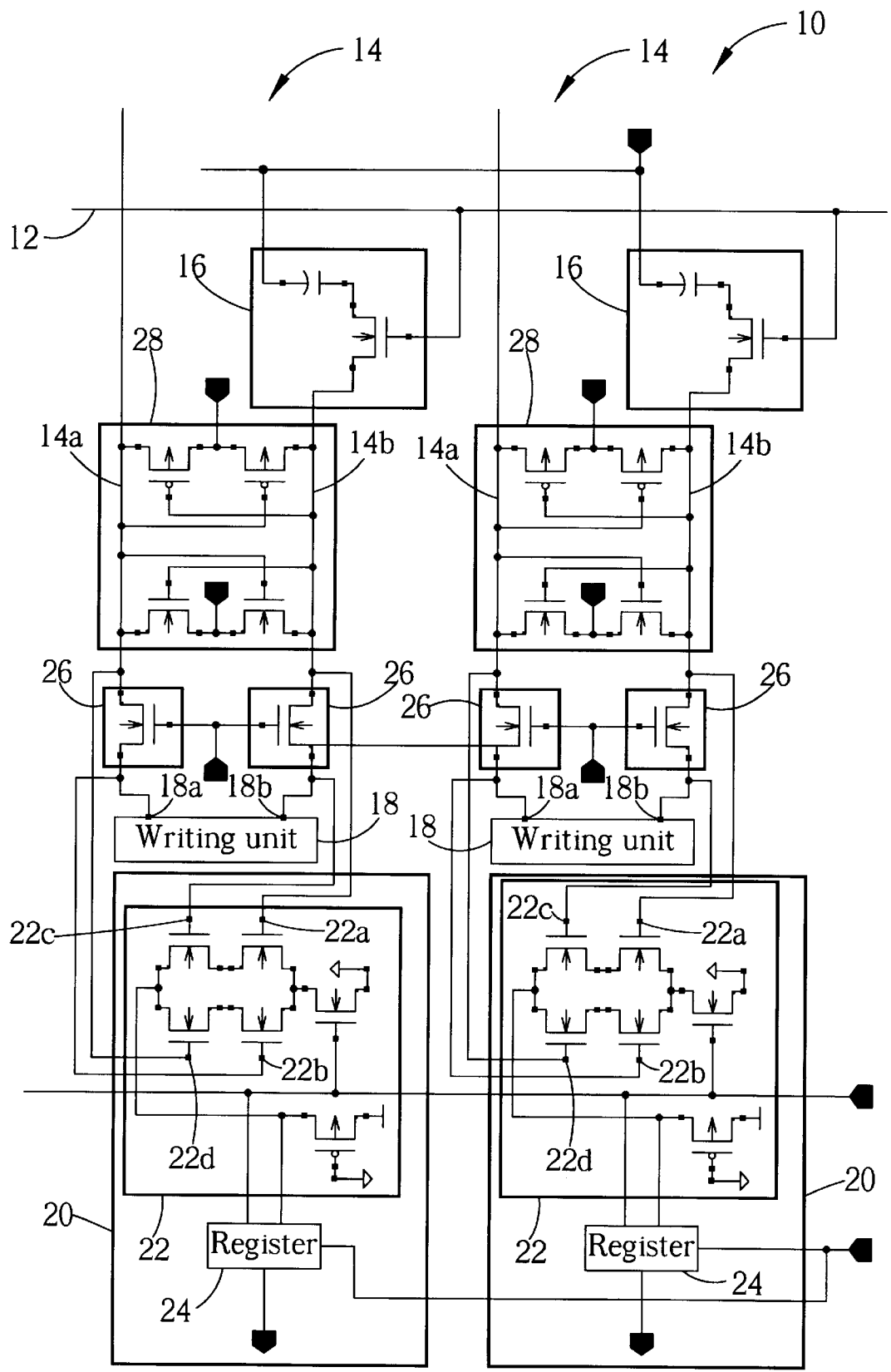
FIG. 2 is a circuit diagram of the memory in FIG. 1.

Please refer to FIG. 1 and FIG. 2. FIG. 1 is a block diagram of a memory 10 according to the present invention. FIG. 2 is a circuit diagram of the memory 10 in FIG. 1. Memory 10 is a memory having testing units 20. The memory 10 comprises a plurality of word lines 12, a plurality of bit line groups 14, a plurality of memory units 16, a plurality of writing units 18, a plurality of testing units 20, a plurality of bit line switches 26, a plurality of latch units 28, and a control circuit (not shown).

Each bit line group 14 comprises two bit lines 14a, 14b. Each memory unit 16 is a dynamic random access memory cell connected between each of the word lines 12 and one bit line 14b of each of the bit line groups 14. The word line 12 connected to the memory unit 16 is used for initiating the memory unit 16 to input or output a binary data bit through the bit line 14b connected to the memory unit 16. Each of the latch units 28 is connected between two bit lines 14a, 14b of one bit line group 14. Each of the writing units 18 comprises two output ports 18a, 18b separately connected to the two bit lines 14a, 14b of one of the bit line groups 14 for simultaneously outputting two opposite binary data bits. Each of the bit line switches 26 is an N-type MOS transistor and is connected between one output port 18a, 18b of each writing unit 18 and the bit line 14a, 14b connected to the output port 18a, 18b for controlling the output from the output port 18a, 18b to the bit line 14a, 14b. The control circuit is used for controlling the operations of the memory 10.

Each of the testing units 20 comprises a test circuit 22 and a register 24. The test circuit 22 comprises four input ports 22a, 22b, 22c, and 22d separately connected to the output ports 18b and 18a of one writing unit 18 and the bit lines 14b and 14a connected to the output ports 18b and 18a. The test circuit 22 is a logical algorithm unit (LAU) and is used for generating a test signal according to the inputs at the four input ports 22a, 22b, 22c, and 22d. The register 24 is connected to the test circuit 22 for storing the test signal.

When a binary data bit is written into the memory unit 16 by the writing unit 18 through its connected bit line 14b, the latch unit 28 will maintain the voltage level of the bit line 14b according to the binary data bit to preserves the binary data bit on the bit line 14b. When the writing unit 18 outputs the binary data bit to the bit line 14b, it also outputs an opposite binary data bit to the bit line 14a at the same time.

The latch unit 28 maintains the voltage level of the bit line 14a according to the opposite binary data bit to keep the binary data bit on the bit line 14a.

Figure 3:
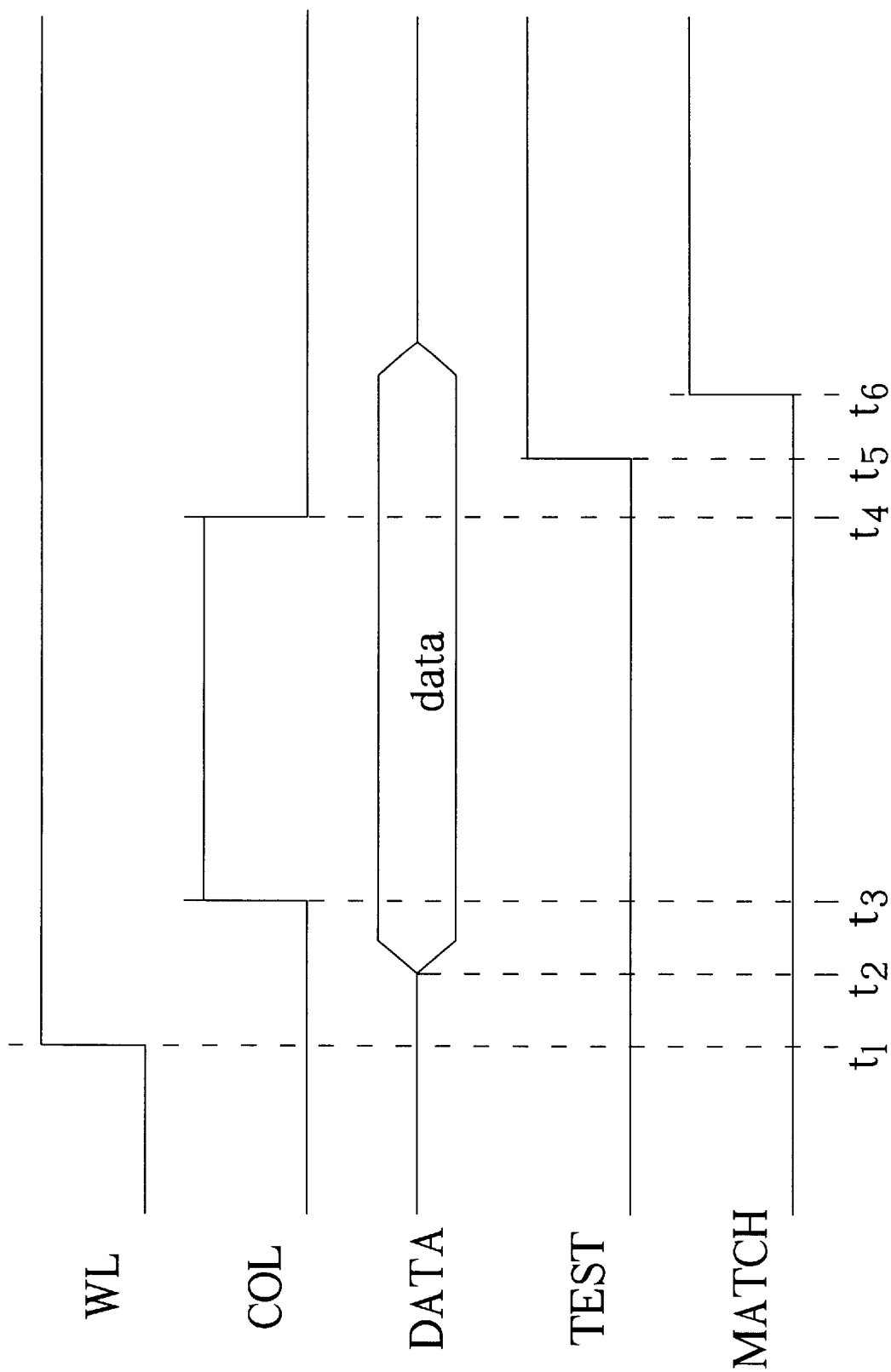
FIG. 3 is a timing diagram of testing the memory in FIG. 1.

Please refer to FIG. 3. FIG. 3 is a timing diagram of testing the memory 10 in FIG. 1. WL represents a control signal outputted from a word line 12. COL represents a control signal for controlling the bit line switch 26. DATA represents a binary data bit outputted from the writing unit 18. TEST represents a control signal for controlling the testing unit 20. MATCH represents a test signal generated by the testing unit 20.

At t1, the control circuit first initiates the memory unit 16 by outputting a control signal to the word line 12. At t2, the writing unit 18 separately outputs a binary data bit and an opposite binary data bit to the output ports 18b and 18a. At t3, the control circuit activates the bit line switch 26 to make the writing unit 18 write the binary data bit into the memory unit 16 through the bit line switch 26 and bit line 14b. At t4, the control circuit deactivates the bit line switch 26. The latch unit 28 then maintains the binary data bit written into the memory unit 16 on the bit line 14b while also maintaining the opposite binary data bit on the bit line 14a. At t5, the control circuit uses the test circuit 22 to generate a corresponding test signal at t6 according to the binary data bits on the bit line 14b, 14a and the binary data bits output from the output ports 18b, 18a of the writing unit 18.

When the binary data bit written into the memory unit 16 and maintained on the bit line 14b is the same as that output from the output port 18b of the writing unit 18, and the binary data bit output from the output port 18a of the writing unit 18 is the same as that on the bit line 14a, and the binary data bits output from the output port 18b, 18a of the writing unit 18 are opposite to each other, the test circuit 22 will output a test signal indicating success. Otherwise, the test circuit 22 will output a test signal indicating failure. The test circuit 22 will output the test signal and store it in the register 24. The control circuit reads out the test signal stored in the register 24 to get the results of the test.

The method for testing a memory unit 16 of the memory 10 comprises the following steps:

(1) initiating the memory unit 16 by using the word line 12 connected to the memory unit 16;

(2) switching on the bit line switch 26;

(3) using the writing unit 18 connected to the memory unit 16 to write a predetermined binary data bit into the memory unit 16 through the output port 18b, the bit line switch 26 and bit line 14b;

(4) switching off the bit line switch 26 after the predetermined binary data bit is written into the memory unit 16;

(5) using the testing unit 20 to test if the binary data bit outputted from the memory unit 16 to the bit line 14b is the same as the binary data bit outputted from the output port 18b, and to generate a corresponding test signal according the test result.

The control circuit tests one word line 12 at a time. The control circuit tests the memory units 16 on the word lines 12 to obtain all test signals of each of the word lines 12. If all test signals indicate success, the memory 10 has no errors. The memory 10 according to the present invention uses a testing method that tests all bits on one word line 12 at one time making reading out of the data from the memory for testing unnecessary. Therefore, testing of the memory 10 is more efficient and the production cost of the memory is reduced. Also, a test machine is not required when testing the memory 10.

Compared with the prior art memory and its testing method, each memory unit 16 of the memory 10 according to the present invention is connected to one test unit 20. The test unit 20 tests if the binary data bit written into the memory unit 16 and kept on the bit line 14b is the same as the binary data bit output from the output port 18b of the writing unit 18. A test signal is generated based on this information. The memory 10 can test all bits on one word line at one time making it unnecessary to read out the data written in the memory for testing. Therefore, testing of the memory 10 is more efficient and the production cost of the memory is reduced. Also, a test machine is not required when testing the memory 10.

Those skilled in the art will readily observe that numerous modifications and alterations of the propeller may be made while retaining the teachings of the invention. Accordingly, the above disclosure should be construed as limited only by the metes and bounds of the appended claims.

What is claimed is:

1. A memory circuit comprising:

a plurality of word lines;

a plurality of bit line groups each having two bit lines;

a memory unit connected between each of the word lines and one bit line of each of the bit line groups wherein the word line connected to the memory unit is used for initiating the memory unit to input or output a binary data bit through the bit line connected to the memory unit;

a plurality of writing units, each of the writing units comprising two output ports separately connected to the two bit lines of one of the bit line groups for simultaneously outputting two opposite binary data bits;

a plurality of testing units, each of the testing units comprising at least two input ports separately connected to an output port of one writing unit and the bit line connected to the output port, a test circuit for generating a test signal according to the inputs from the two input ports, and a register connected to the test circuit for storing the test signal;

a plurality of bit line switches, each of the bit line switches being connected between one output port of each writing unit and the bit line connected to the output port for controlling the output from the output port to the bit line; and a control circuit for controlling the operations of the memory circuit;

a plurality of latch units, each of the latch units being connected between two bit lines of one bit line group for maintaining the voltage level of the first bit line according to the binary data bit outputted from the memory unit and outputting an opposite binary data bit to the second bit line of the bit line group when one memory unit outputting a binary data bit through a first bit line of one bit line group connected to the memory unit;

wherein when testing the memory unit, the control circuit first initiates the memory unit by using the word line connected to the memory unit, and then uses the writing unit connected to the memory unit to write a predetermined binary data bit into the memory unit through one output port of the writing unit connected to the memory unit and the bit line switch and bit line connected between the output port of the writing unit and the memory unit, and then switches off the bit line switch to disconnect the bit line connected to the output port of the writing unit, and finally using the testing unit connected to the output port and the disconnected bit line to test if the binary data bit outputted from the memory unit to the disconnected bit line is the same as the binary data bit outputted from the output port.

2. The memory circuit of claim 1 wherein when the testing unit connected to the memory unit determines that the binary data bit outputted from the memory unit to the bit line is the same as the predetermined binary data bit outputted from the output port of the writing unit, the testing unit outputs a test signal indicating success.

3. The memory circuit of claim 1 wherein each of the testing units has four input ports separately connected to two output ports of one writing unit and the two bit lines connected to the two output ports and the test circuit of the testing unit generates test signals according to the inputs from the four input ports.

4. The memory circuit of claim 3 wherein when testing the memory unit, the control circuit first initiates the memory unit by using the word line connected to the memory unit, and then uses the writing unit connected to the memory unit to write a predetermined binary data bit into the memory unit through one output port of the writing unit connected to the memory unit and the bit line switch and bit line connected between the output port of the writing unit and the memory unit, and then switches off the two bit line switches connected to the two output ports of the writing unit to disconnect the two bit lines connected to the two output ports of the writing unit, and finally using the testing unit connected to the two output ports and the two disconnected bit lines to test if the two binary data bits presented on the two disconnected bit lines are the same as the two binary data bits outputted from the two output ports of the writing unit.

5. The memory circuit of claim 4 wherein when the testing unit connected to the two output ports of the writing unit determines that the binary data bit outputted from the memory unit to the bit line connected to the memory unit is the same as the binary data bit outputted from the first output port of the writing unit connected to the memory unit, and the binary data bit outputted from the second output port of the writing unit is the same as the binary data bit presented on the bit line connected to the second output port, and the binary data bit outputted from the first output port is opposite to the binary data bit outputted from the second output port of the writing unit, the testing unit outputs a test signal indicating success.

6. The memory circuit of claim 1 wherein the memory unit is a dynamic random access memory cell.

7. The memory circuit of claim 1 wherein the bit line switch is an N-type MOS transistor.

8. A method for testing a memory circuit, the memory circuit comprising:
   a plurality of word lines;
   a plurality of bit line groups each having two bit lines;
   a memory unit positioned between each of the word lines and one bit line of each of the bit line groups wherein the word line connected to the memory unit is used for initiating the memory unit to input or output a binary data bit through the bit line connected to the memory unit;
   a plurality of writing units, each of the writing units comprising two output ports separately connected to the two bit lines of one bit line group for simultaneously outputting two opposite binary data bits;
   a plurality of testing units, each of the testing units comprising at least two input ports separately connected to an output port of one writing unit and the bit line connected to the output port, and a test circuit for generating a test signal according to the inputs from the two input ports;
   a plurality of bit line switches, each of the bit line switches being connected between one output port of each writing unit and the bit line connected to the output port for controlling the output from the output port to the bit line;
   a plurality of latch units, each of the latch units being connected between two bit lines of one bit line group for maintaining the voltage level of the first bit line according to the binary data bit outputted from the memory unit and outputting an opposite binary data bit to the second bit line of the bit line group when one memory unit outputting a binary data bit through a first bit line of one bit line group connected to the memory unit;

the method for testing the memory unit comprising:
   initiating the memory unit by using the word line connected to the memory unit;
   using the writing unit connected to the memory unit to write a predetermined binary data bit into the memory unit through one output port of the writing unit connected to the memory unit and the bit line switch and bit line connected between the output port of the writing unit and the memory unit;
   switching off the bit line switch after the predetermined binary data bit is written into the memory unit to disconnect the bit line connected to the output port of the writing unit; and
   using the testing unit connected between the output port of the writing unit and the disconnected bit line to test if the binary data bit outputted from the memory unit to the disconnected bit line is the same as the binary data bit outputted from the output port of the writing unit.

9. The method of claim 8 further comprising:
   switching on the bit line switch connected to the output port of the writing unit prior to writing the predetermined binary data bit from the output port of the writing unit into the memory unit.

10. The method of claim 8 wherein when the testing unit connected to the memory unit determines that the binary data bit outputted from the memory unit to the disconnected bit line is the same as the predetermined binary data bit outputted from the output port of the writing unit, the testing unit outputs a test signal indicating success.

11. The method of claim 8 wherein each of the testing units has four input ports separately connected to the two output ports of one writing unit and the two bit lines connected to the two output ports, and the test circuit of the testing unit generates a test signal according to the inputs from the four input ports.

12. The method of claim 11 wherein when testing the memory unit, the control circuit first initiates the memory unit by using the word line connected to the memory unit, and then uses the writing unit connected to the memory unit to write a predetermined binary data bit into the memory unit through one output port of the writing unit connected to the memory unit and the bit line switch and bit line connected between the output port of the writing unit and the memory unit, and then switches off the two bit line switches connected to the two output ports of the writing unit to disconnect the two bit lines connected to the two output ports of the writing unit, and finally using the testing unit connected to the two output ports and the two disconnected bit lines to test if the two binary data bits presented on the two disconnected bit lines are the same as the two binary data bits outputted from the two output ports of the writing unit.

13. The method of claim 12 wherein when the testing unit connected to the two output ports of the writing unit determines that the binary data bit outputted from the memory unit to the bit line connected to the memory unit is the same as the binary data bit outputted from the first output port of the writing unit connected to the memory unit, and the binary data bit outputted from the second output port of the writing unit is the same as the binary data bit presented on the bit line connected to the second output port, and the binary data bit outputted from the first output port is opposite to the binary data bit outputted from the second output port of the writing unit, the testing unit outputs a test signal indicating success.

14. A memory circuit comprising:
   a memory unit connected with a word line for initiating the memory unit, and a bit line for inputting or outputting a binary data bit;
   a writing unit having an output port connected to the bit line of the memory unit for writing a binary data bit into the memory unit through the bit line;
   a bit line switch connected between the output port of the writing unit and the bit line of the memory unit for controlling the output from the output port to the bit line;
   a testing unit having two input ports separately connected to the output port of the writing unit and the bit line of the memory unit, and a test circuit for generating a test signal according to the inputs from the two input ports;
   a control circuit for controlling the operations of the memory; and
   a latch unit connected to the bit line for maintaining the voltage level of the bit line according to the binary data bit outputted from the memory unit when the memory unit outputting a binary data bit to the bit line;
wherein when testing the memory unit, the control circuit initiates the memory unit by using the word line connected to the memory unit, uses the writing unit to write a predetermined binary data bit into the memory unit through the bit line switch and bit line, switches off the bit line switch to disconnect the bit line from the output port of the writing unit, and uses the testing unit to test if the binary data bit outputted from the memory unit to the disconnected bit line is the same as the predetermined binary data bit outputted from the output port of the writing unit.

* * * * *